(12) United States Patent
Gopalan et al.

(10) Patent No.: US 9,099,633 B2
(45) Date of Patent: Aug. 4, 2015

(54) SOLID ELECTROLYTE MEMORY ELEMENTS WITH ELECTRODE INTERFACE FOR IMPROVED PERFORMANCE

(71) Applicant: Adesto Technologies Corporation, Sunnyvale, CA (US)

(72) Inventors: Chakravarthy Gopalan, Santa Clara, CA (US); Wei Ti Lee, San Jose, CA (US); Yi Ma, Santa Clara, CA (US); Jeffrey Allan Shields, Sunnyvale, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/850,267

(22) Filed: Mar. 25, 2013

(65) Prior Publication Data

US 2013/0285004 A1  Oct. 31, 2013

Related U.S. Application Data

(60) Provisional application No. 61/615,837, filed on Mar. 26, 2012.

(51) Int. Cl.
*H01L 45/00* (2006.01)

(52) U.S. Cl.
CPC .............. *H01L 45/04* (2013.01); *H01L 45/085* (2013.01); *H01L 45/1233* (2013.01); *H01L 45/1266* (2013.01); *H01L 45/142* (2013.01); *H01L 45/143* (2013.01); *H01L 45/1608* (2013.01); *H01L 45/1625* (2013.01)

(58) Field of Classification Search
CPC .... H01L 27/11556; H01L 24/24; H01L 45/04
See application file for complete search history.

(56) References Cited

U.S. PATENT DOCUMENTS

| 5,761,115 | A | 6/1998 | Kozicki et al. |
|---|---|---|---|
| 6,418,049 | B1 | 7/2002 | Kozicki et al. |
| 6,487,106 | B1 | 11/2002 | Kozicki |
| 6,635,914 | B2 | 10/2003 | Kozicki et al. |
| 6,825,489 | B2 | 11/2004 | Kozicki |
| 6,927,411 | B2 | 8/2005 | Kozicki |
| 6,985,378 | B2 | 1/2006 | Kozicki |
| 7,101,728 | B2 | 9/2006 | Kozicki et al. |
| 7,294,875 | B2 | 11/2007 | Kozicki |
| 7,307,270 | B2 | 12/2007 | Aratani et al. |
| 7,345,295 | B2 | 3/2008 | Ufert |
| 7,372,065 | B2 | 5/2008 | Kozicki et al. |
| 7,385,219 | B2 | 6/2008 | Kozicki et al. |
| 7,586,215 | B2 * | 9/2009 | Hattori et al. ............... 307/141 |
| 7,675,053 | B2 | 3/2010 | Mizuguchi et al. |

(Continued)

OTHER PUBLICATIONS

PCT International Search Report for International Application No. PCT/US13/33934, dated Jul. 3, 2013.

(Continued)

*Primary Examiner* — William Coleman

(57) ABSTRACT

A memory element can include a first electrode; a second electrode; and a memory material programmable between different resistance states, the memory material disposed between the first electrode and the second electrode and comprising a solid electrolyte with at least one modifier element formed therein; wherein the first electrode is an anode electrode that includes an anode element that is ion conductible in the solid electrolyte, the anode element being different than the modifier element.

16 Claims, 12 Drawing Sheets

(56) References Cited

U.S. PATENT DOCUMENTS

| | | | |
|---|---|---|---|
| 7,719,082 B2 | 5/2010 | Aratani et al. | |
| 7,728,322 B2 | 6/2010 | Kozicki | |
| 7,772,029 B2 | 8/2010 | Aratani et al. | |
| 8,115,282 B2* | 2/2012 | Mege | 257/613 |
| 8,178,379 B2* | 5/2012 | Blanchard et al. | 438/51 |
| 8,222,713 B2 | 7/2012 | Kouchiyama et al. | |
| 8,420,526 B2* | 4/2013 | Gutsche et al. | 438/622 |
| 8,501,533 B2* | 8/2013 | Cholet | 438/102 |
| 8,625,322 B2* | 1/2014 | Samachisa et al. | 365/51 |
| 8,699,260 B2* | 4/2014 | Ohba et al. | 365/148 |
| 2005/0226062 A1 | 10/2005 | Aratani et al. | |
| 2007/0029538 A1 | 2/2007 | Pinnow | |
| 2008/0078983 A1 | 4/2008 | Raberg | |
| 2009/0146131 A1* | 6/2009 | Happ | 257/5 |
| 2010/0012911 A1 | 1/2010 | Akinaga et al. | |
| 2010/0135060 A1 | 6/2010 | Aratani et al. | |
| 2010/0195371 A1 | 8/2010 | Ohba et al. | |
| 2010/0259967 A1 | 10/2010 | Yasuda et al. | |
| 2011/0027597 A1 | 2/2011 | Ohba et al. | |
| 2011/0031466 A1 | 2/2011 | Kagawa et al. | |
| 2011/0194329 A1 | 8/2011 | Ohba et al. | |

OTHER PUBLICATIONS

PCT Written Opinion of the International Search Authority for International Application No., dated Jul. 3, 2013.

* cited by examiner

| PG Yield | ER Yield | PAGE time |
|---|---|---|
| 68.90% | 35.21% | 0.00 |
| 99.93% | 99.19% | 0.00 |
| 99.98% | 99.73% | 2.00 |
| 99.95% | 99.44% | 28.00 |
| 100.00% | 98.85% | 134.00 |
| 100.00% | 99.19% | 538.00 |
| 98.68% | 99.17% | 0.00 |
| 99.98% | 99.00% | 2.00 |
| 100.00% | 98.95% | 28.00 |
| 100.00% | 98.88% | 134.00 |
| 100.00% | 98.61% | 536.00 |

FIG. 12

| | PG Yield | | ER Yield | | PAGE time | |
|---|---|---|---|---|---|---|
| | Wafer2 | Wafer11 | Wafer2 | Wafer11 | Wafer2 | Wafer11 |
| NO PC | 99.93% | 99.77% | 95.74% | 99.38% | 10.7 | 21.3 |
| NO PC | 100.00% | 99.97% | 99.02% | 99.25% | 8.0 | 24.0 |
| 3 PC | 100.00% | 99.97% | 97.10% | 96.94% | 2.7 | 2.7 |
| 3 PC | 100.00% | 100.00% | 96.26% | 97.49% | 2.7 | 2.7 |

SOLID ELECTROLYTE MEMORY ELEMENTS WITH ELECTRODE INTERFACE FOR IMPROVED PERFORMANCE

This application claims the benefit of U.S. provisional patent application Ser. No. 61/615,837, filed on Mar. 26, 2012, the contents of which are incorporated by reference herein.

TECHNICAL FIELD

The present disclosure relates generally to memory devices with programmable impedance elements, and more particularly to memory elements that can program a solid electrolyte layer between different resistance states.

BACKGROUND

Conventional conductive bridging random access memory (CBRAM) devices can include CBRAM type elements that can be placed into a low resistance state with a programming operation, and a high resistance state with an erase operation. Conventionally, after a CBRAM device has been fabricated, but before it is programmed or erased to store data for the very first time (i.e., the CBRAM elements are "fresh" elements), the CBRAM device is subject to a "forming" step. It is believed that the forming step can create an initial conductive path (i.e., filament) through a solid electrolyte material, which can be recreated, in some fashion, in subsequent programming operations (and dissolved in erase operations).

A forming step can take a relatively large amount of time in an integrated circuit manufacturing flow, and thus can present a production bottleneck. The amount of time consumed in a forming step can be exacerbated by the presence of "reverse programming". Reverse programming can occur when erase conditions are applied to a CBRAM type element, but the element enters a low resistance state, instead of a desired high resistance state. If reverse programming occurs, it can take a substantial amount of time to bring the CBRAM elements from the reverse programmed state to a proper erased state.

In some conventional CBRAM devices, the effects of a forming step can be reversed or reduced if a device is subject to a heat cycle (such as a solder reflow on a packaged device).

BRIEF DESCRIPTION OF THE DRAWINGS

FIGS. 11A-0 to 11A-3 are graphs showing program experimental results for memory elements according to some embodiments.

FIGS. 11B-0 to 11B-3 are graphs showing erase experimental results for memory elements according to some embodiments.

FIGS. 11C-0 to 11C-3 are graphs showing reverse program experimental results for memory elements according to some embodiments FIG. 12 is a table showing experimental results for memory elements according to particular embodiments.

FIGS. 13-0 to 13-2 are graphs showing experimental results for memory elements according to additional embodiments FIG. 14 is a table showing experimental results for memory elements according to particular embodiments.

DETAILED DESCRIPTION

Figure 1:
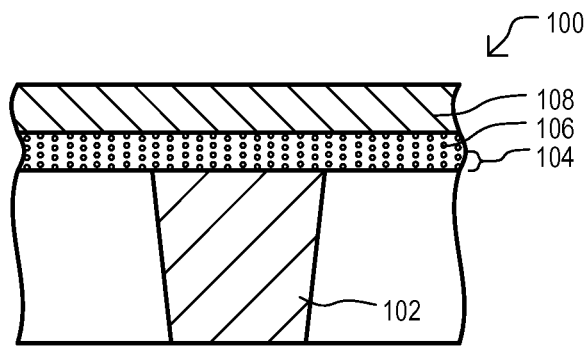
FIG. 1 is a side cross sectional view of a memory element according to one embodiment.

Embodiments described herein show memory elements and manufacturing methods that include a memory layer between an anode electrode and a cathode electrode. A memory layer of a memory element can have a modifier material formed therein, which can result in the memory element having a suitable programming response without the need for a conventional forming step.

In very particular embodiments, memory elements can be conductive bridging random access memory (CBRAM) type cells, programmable between two or more resistance states.

In the various embodiments, like features may be referred to by the same reference character but with a first characters corresponding to the figure number.

FIG. 1 is a side cross sectional view of a memory element 100 according to an embodiment. A memory element 100 can include a cathode electrode 102, an interface layer 104, a memory layer 106 and an anode electrode 108. A memory element 100 can be programmable between two or more different states by altering an impedance between the cathode and anode electrodes (102 and 108).

A cathode electrode 102 can be formed from one or more conductive materials. A cathode electrode 102 can include any suitable material used to form interconnections, contacts, or vias in an integrated circuit device. In very particular embodiments, a cathode electrode 102 can be formed from and of: tungsten, titanium, titanium nitride, aluminum, tantalum, or tantalum nitride.

An interface layer 104 can be formed from a solid electrolyte with one or more modifier materials. In some embodiments, a memory element 100 can be a CBRAM element, and creating an interface layer 104 with modifier materials can alter the cathode-memory layer interface, enabling CBRAM elements to function without a conventional forming step.

In some embodiments, an interface layer 104 can include a chalcogen based solid electrolyte (e.g., a chalcogenide), a metal oxide, or a combination thereof. In a particular embodiment, a solid electrolyte can include germanium sulfide ($GeS_2$), germanium-sulfur compounds of different stoichiometries (GeSx) and/or germanium selenium compounds (e.g., GeSe).

In some embodiments a modifier material added to a solid electrolyte can include a metal. A modifier metal can be a transition metal, including but not limited to copper (Cu), tantalum (Ta) or ruthenium (Ru), as well as the rare earth elements. A modifier can also include a post-transition metal such as aluminum (Al), as but one example. Post-transition metals are metals from those periodic table groups that occur after the transition metal groups (i.e., groups IIIA, IVA and VA), and include alumimun (Al), gallium (Ga), indium (In), thallium (Tl), tin (Sn), lead (Pb) and bismuth (Bi).

In one very particular embodiment, an interface layer can include GeSx with Cu as a modifier metal, at 0.1% to 50% (atomic percent).

As understood from above, other embodiments can include a metal oxide with a modifier metal formed therein.

As will be shown below, inclusion of a modifier metal in an interface layer may make it possible to program and erase the memory element without a conventional forming step.

While modifier materials can include metals incorporated into a solid electrolyte, in other embodiments, a modifier material can be a non-metal. In very particular embodiments, a modifier non-metal can include oxygen (O) or nitrogen (N), as but two possible examples. In other embodiments, a modifier non-metal can include a semiconductor or metalloid, such as silicon (Si) or Ge (where Ge is not part of the solid electrolyte material).

In one very particular embodiment, an interface layer can include GeSx with N as a modifier metal, at 0.1% to 40% (atomic percent).

Referring still to FIG. 1, in some embodiments, a memory layer 106 can be formed from the same material as interface layer 104. That is, memory layer 106 and interface layer 104 can form a single layer of the same material. However, as will be shown below, in other embodiments such layers are different.

In some embodiments, a total thickness of memory layer 106 and interface layer 104 can be in the range of 3 to 1000 angstroms (Å).

An anode electrode 108 can be formed from one or more metals that ion conduct within memory layer 106 and interface layer 104. However, when a modifier metal is included in interface layer 104, such a metal can be different than the anode metal. In one very particular embodiment, an anode electrode 108 can be formed of silver (Ag), while an interface layer 104 can be formed of GeSx with Cu as a modifier metal.

Figure 2:
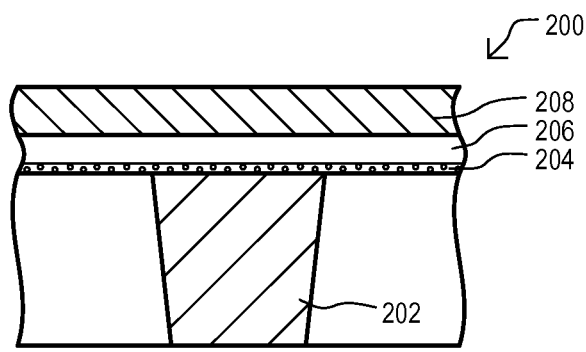
FIG. 2 is a side cross sectional view of a memory element according to another embodiment.

FIG. 2 is a side cross sectional view of a memory element 200 according to another embodiment. A memory element 200 can include structures like those of FIG. 1.

However, unlike FIG. 1, in FIG. 2, a memory layer 206 can be different than an interface layer 204. In one embodiment, a memory layer 206 can be formed from a same solid electrolyte as interface layer 204, but not include the modifier material(s) present in the interface layer 204. In very particular embodiments, a memory layer 206 and interface layer 204 can be formed from the same solid electrolyte, but with the memory layer 206 not including the modifier material(s).

An interface layer 204 can be formed from the same materials, and subject to the same variation as noted for interface layer 104 shown in FIG. 1.

In some embodiments, a total thickness of memory layer 206 and interface layer 204 can be in the range of 3 to 1000 angstroms (Å). An interface layer 204 can have a thickness less than that of memory layer 206. In particular embodiments, an interface layer 204 have less than ½ the thickness of memory layer 206, preferably less than ¼ the thickness of memory layer 206.

While the embodiments above have shown modifications of a cathode-memory layer interface with a layer formed on a cathode electrode, other embodiments can modify a cathode electrode material to form an interface layer. One such embodiment is shown in FIG. 3.

Figure 3:
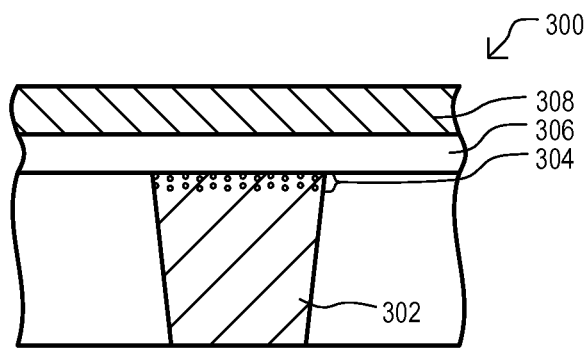
FIG. 3 is a side cross sectional view of a memory element according to a further embodiment.

FIG. 3 shows a memory element 300 according to another embodiment in a side cross sectional view. A memory element 300 can include structures like those of FIG. 1.

Unlike FIG. 1 or 2, an interface layer 304 can be formed as part of a surface of cathode electrode 302. An interface layer 304 can be formed from the same conductive materials as cathode electrode 302, but in addition, can also include one or more modifier materials. Such modifier materials an include any of those noted herein, or equivalents, including non-metals and/or metals.

In some embodiments, an interface layer 304 can extend into a cathode electrode 302 to a depth in the range of 3 to 1000 angstroms (Å).

A memory layer 306 can include one or more solid electrolytes. In some embodiments, a solid electrolyte of interface layer 304 can include a chalcogenide, a metal oxide, or combinations thereof. In a particular embodiment, a solid electrolyte can include $GeS_2$, GeSx and/or GeSe.

While the embodiments of FIGS. 1 to 3 show memory elements with anode electrodes formed over cathode electrodes, other embodiments can have different orientations. As but one example, the structures shown in FIGS. 1-3 can have a reverse vertical order, with a cathode being formed over an anode, and the interface layers being formed over the memory layers.

FIGS. 4A to 4D are a sequence of side cross sectional views showing one particular method of forming a memory element like that of FIG. 1, in which an interface layer and memory layer can have the same structure.

Figure 4A:
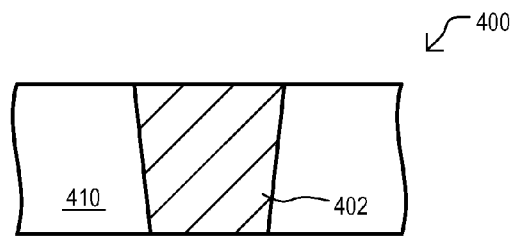
FIGS. 4A to 4D are a series of side cross sectional views showing a method of making a memory element like that of FIG. 1, according to one very particular embodiment.

FIG. 4A shows a cathode electrode 402 formed in an insulating material 410. A cathode electrode 402 can have a surface (in this embodiment a top surface) exposed.

Figure 4B:
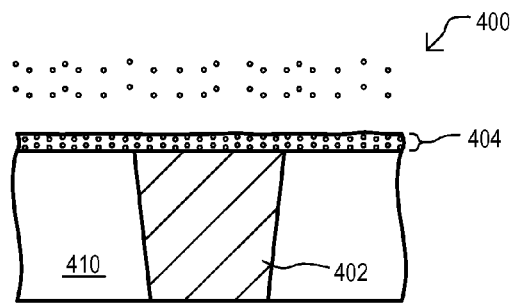

FIG. 4B shows the formation of interface layer 404 in contact with the exposed surface of cathode electrode 402. In particular embodiments, an interface layer 404 can be deposited with sputtering methods. In one embodiment, such sputtering can include co-sputtering one target formed from one or more solid electrolyte materials, and another target that includes a modifier material. In another embodiment, such sputtering can sputter one target that includes both a solid electrolyte material and a modifier material. In particular embodiments, sputtering can include physical vapor deposition (PVD). Sputtering can be a suitable method for modifier materials that are metals (e.g., Cu, Ta, Ru, Al).

In addition or alternatively, an interface layer 404 can be deposited with reactive sputtering. More particularly, one or more gases containing the modifier materials can be introduced into the plasma. Reactive sputtering can be a suitable method for modifier materials that are non-metals (e.g., O, N). In a particular embodiment, a reactive sputtering process can sputter GeSx and/or $GeS_2$ in a plasma formed by argon gas (Ar) together with nitrogen gas ($N_2$) providing non-metal modifier N. A flow ratio between $N_2$:Ar can be in the range of 0.05 to 2.

It is understood that an interface layer 404 can be formed form any other suitable method. Such alternate methods can include, but are not limited to: evaporative methods, chemical vapor deposition (CVD), including plasma enhanced CVD, atomic layer deposition, or electroplating, as but a few examples.

Figure 4C:
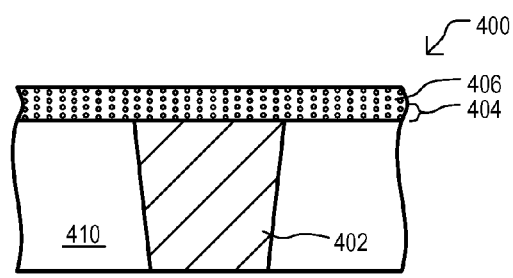

FIG. 4C shows the formation of memory layer 406. In one embodiment, a memory layer 406 can be formed in the same manner as interface layer 404. That is, interface layer 404 and memory layer 406 can be formed in a continuous deposition step. However, in some embodiments, an interface layer 404 can be formed as a separate layer than memory layer 406.

Figure 4D:
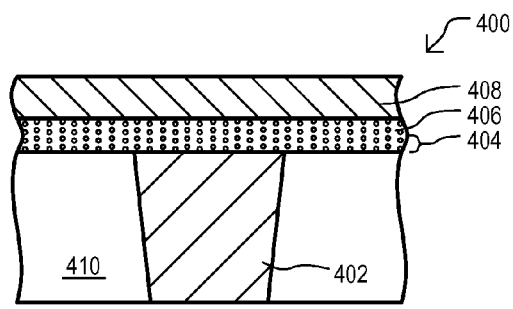

FIG. 4D shows the formation of anode electrode 408 over and in contact with memory layer 406.

FIGS. 5A to 5D are a sequence of side cross sectional views showing one particular method of forming a memory element like that of FIG. 2, in which an interface layer can be different from a memory layer.

Figure 5A:
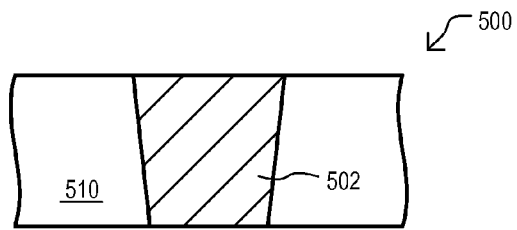
FIGS. 5A to 5D are a series of side cross sectional views showing a method of making a memory element like that of FIG. 2, according to one very particular embodiment.
Figure 5B:
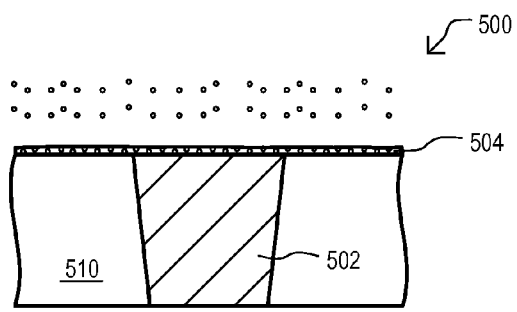

FIGS. 5A and 5B show steps like that of FIGS. 4A and 4B, respectively, and equivalents. Such steps can be subject to the same variations.

Figure 5C:
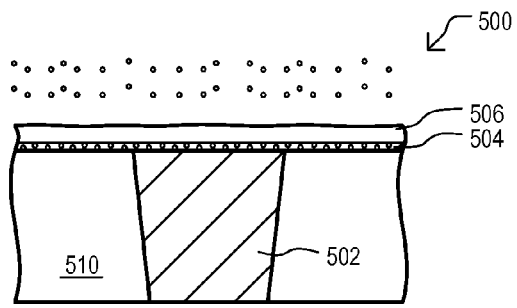

FIG. 5C shows the formation of memory layer 506. In one embodiment, a memory layer 506 can be formed in the same manner as interface layer 504, but not include modifier material(s), or have a different concentration of modifier material(s). Thus, in some embodiments an interface layer 504 and memory layer 506 can be formed with a same deposition type, but turning off, or otherwise altering a source of modifying materials while forming the memory layer.

In other embodiments, an interface layer 504 can be formed as a separate layer than memory layer 506. Further, a solid electrolyte material of memory layer 506 can be different than that of interface layer 504.

Figure 5D:
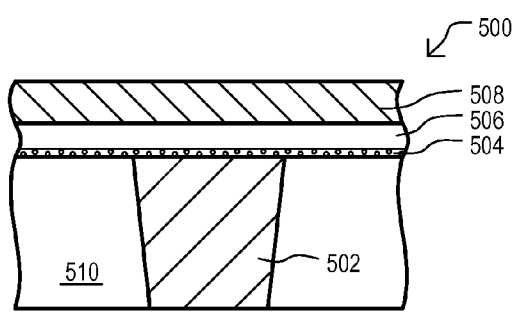

FIG. 5D shows a step like that of FIG. 5D, and can be subject to the same variations.

FIGS. 6A to 6D are a sequence of side cross sectional views showing one particular method of forming a memory element like that of FIG. 3, in which a bottom electrode can include an interface layer.

Figure 6A:
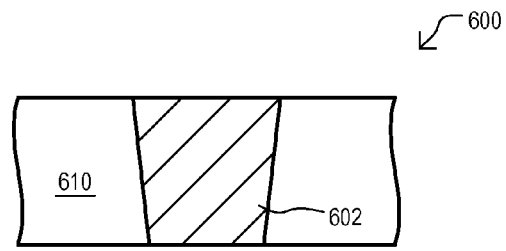
FIGS. 6A to 6D are a series of side cross sectional views showing a method of making a memory element like that of FIG. 3, according to one very particular embodiment.

FIG. 6A shows a step like that of FIG. 5A, and can be subject to the same variations.

Figure 6B:
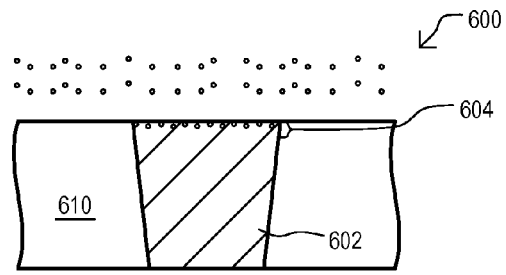

FIG. 6B shows the forming of interface layer 604 as part of a surface of cathode electrode 602. In some embodiments, an interface layer 604 can be created by treating of a surface of cathode electrode 602. A treating of the surface can incorporate modifier materials into a top portion of cathode electrode 602 to thereby form interface layer 604. A surface treatment can include any suitable method that can form a modifier material(s) to a desired depth. In particular embodiments, a surface treatment can include any of: subjecting the surface to a temperature cycle in an environment that includes the modifier material; oxidizing the surface; ion implanting into the surface; and/or exposing the surface to a plasma having a gas that includes the modifier material.

In alternate embodiments, an interface layer can be created with methods noted in FIGS. 4A to 4D. In particular, as a cathode electrode is being formed, modifier material(s) can be introduced.

Figure 6C:
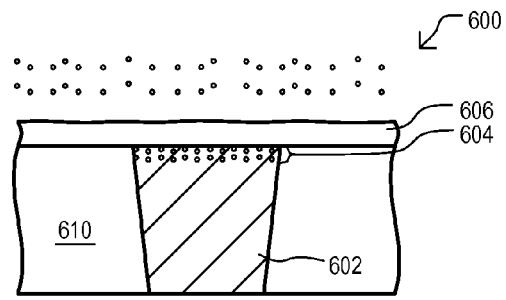
Figure 6D:
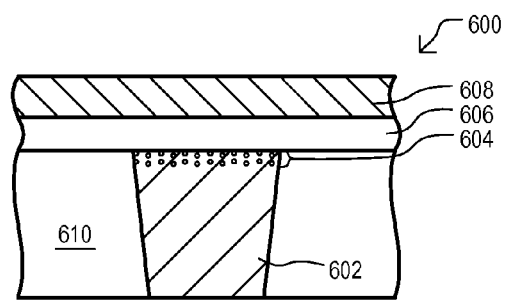

FIG. 6C shows steps like that of FIG. 5C, or equivalents.
FIG. 6D shows steps like that of FIG. 5D, or equivalents.

While the embodiments of FIGS. 1 to 6D show a memory element having an interface layer formed between a cathode and a memory material, other embodiments can include an interface layer between an anode and a memory material. Examples of such embodiments are shown in FIGS. 7 to 10C.

Figure 7:
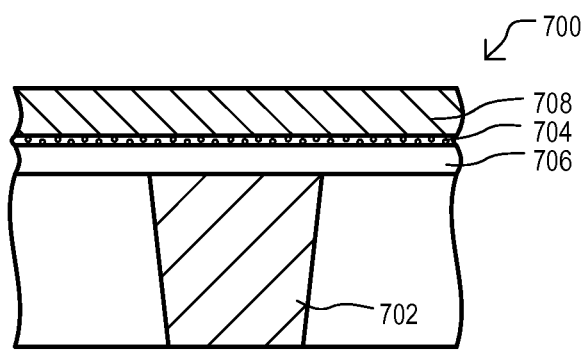
FIG. 7 is a side cross sectional view of a memory element according to another embodiment.

FIG. 7 is a side cross sectional view showing a memory element 700 according to another embodiment. A memory element 700 can include structures like those of FIG. 2.

Like FIG. 2, in FIG. 7 a memory layer 706 can be different than an interface layer 704. However, unlike FIG. 2, an interface layer 704 can be formed between anode electrode 708 and memory layer 706. In one embodiment, a memory layer 706 can be formed from a solid electrolyte, and an interface layer 704 can be formed from the same solid electrolyte, but also include one or more modifier material(s) not present in the memory layer 706.

An interface layer 704 can be formed from the same materials, and subject to the same variation as noted for interface layer 204 shown in FIG. 2.

Figure 8:
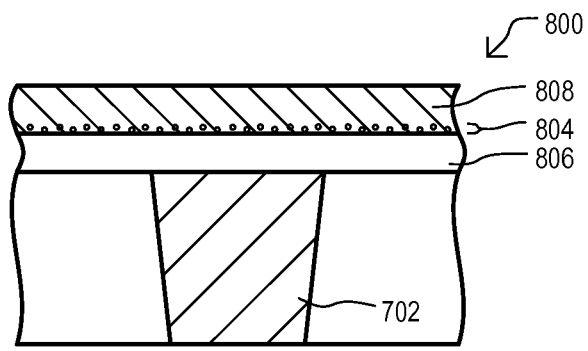
FIG. 8 is a side cross sectional view of a memory element according to another embodiment.

FIG. 8 is a side cross sectional view showing a memory element 800 according to another embodiment. A memory element 800 can include structures like those of FIG. 7.

Unlike FIG. 7, an interface layer 804 can be formed as part of anode electrode 808. An interface layer 804 can be formed from the same conductive materials as anode electrode 808, but in addition, can also include one or more modifier materials. Such modifier materials can include any of those noted herein, or equivalents, including non-metals and/or metals.

In one very particular embodiment, an anode electrode 808 can be formed of silver, and an interface layer 804 can be formed of copper.

In some embodiments, an interface layer 804 can occupy an initial thickness of anode electrode 808 in the range of 3 to 1000 angstroms (Å).

A memory layer 806 can include one or more solid electrolytes. In some embodiments, a solid electrolyte of interface layer 804 can include a chalcogenide, a metal oxide, or combinations thereof. In a particular embodiment, a solid electrolyte can include $GeS_2$, GeSx and/or GeSe.

Figure 9A:
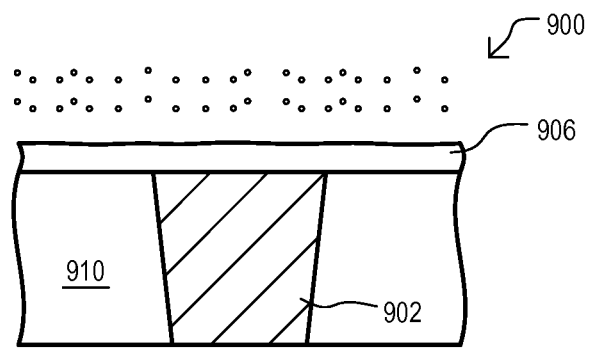
FIGS. 9A to 9C are a series of side cross sectional views showing a method of making a memory element like that of FIG. 7, according to one very particular embodiment.
Figure 9B:
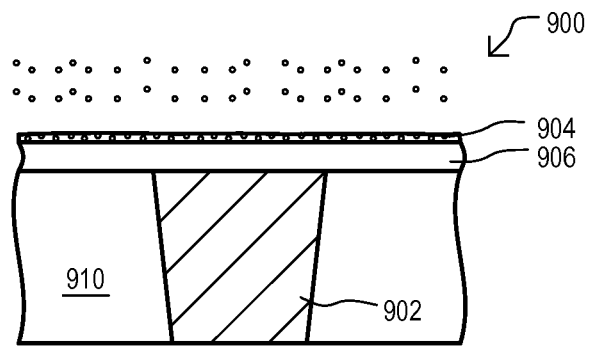
Figure 9C:
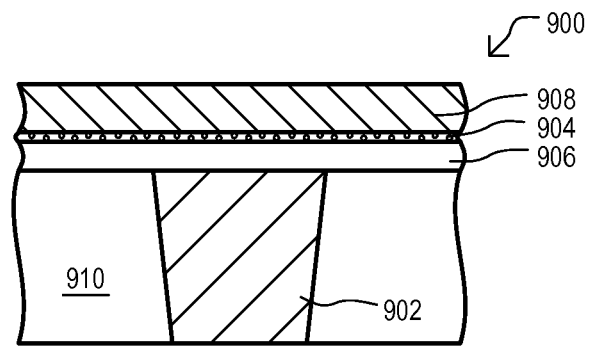

FIGS. 9A to 9C are a sequence of side cross sectional views showing one particular method of forming a memory element like that of FIG. 7, in which an interface layer can be formed between an anode and a memory layer.

FIG. 9A can shows a step like that of FIG. 5C (the formation of a memory layer 906). However, unlike FIG. 5C, such a memory layer is formed on a cathode 902, and not an interface layer.

FIG. 9B shows a step like that of FIG. 5B (the formation of an interface layer 904). However, unlike FIG. 5B, such an interface layer is formed on a top portion of memory layer 906 and not a cathode.

FIG. 9C shows a step like that of FIG. 5D. An anode 908 can be formed over and in contact with interface layer 904.

Figure 10A:
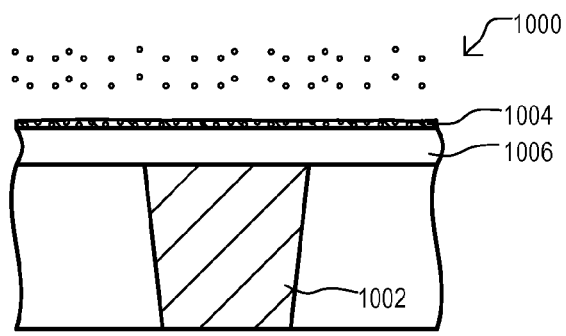
FIGS. 10A to 10C are a series of side cross sectional views showing a method of making a memory element like that of FIG. 8, according to one very particular embodiment.
Figure 10B:
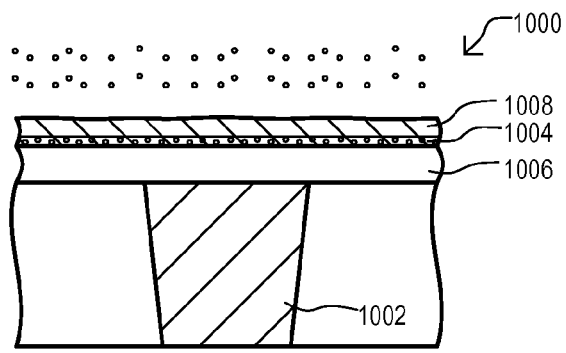
Figure 10C:
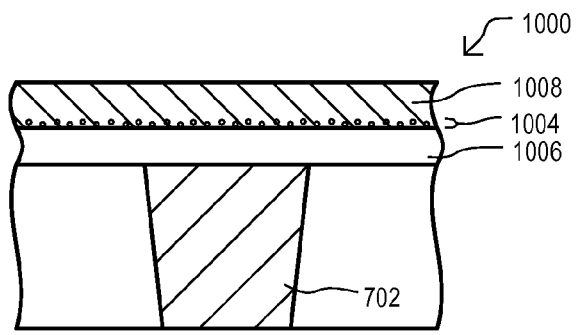

FIGS. 10A to 10C are side cross sectional views showing one particular method of forming a memory element like that of FIG. 8, in which an interface layer can occupy a portion of an anode that interfaces with a memory layer.

FIG. 10A shows the forming of interface layer 1004 as part of an initial portion of anode electrode 1008. In some embodiments, an interface layer 1004 can be created by treating an initial portion of an anode electrode 1008. A treating of the anode electrode can incorporate modifier materials into an initial portion of anode electrode 1008 to thereby form interface layer 1004. A surface treatment can include any suitable method that can form a modifier material(s) to a desired depth.

In particular embodiments, an interface layer can be created with methods noted in FIGS. 4A to 4D, or equivalents. In particular, as an anode electrode is being formed, modifier material(s) can be introduced.

In alternate embodiments, a surface treatment can include any of: depositing a modifier material; subjecting the surface to a temperature cycle in an environment that includes the modifier material; oxidizing the surface; ion implanting into the surface; and exposing the surface to a plasma having a gas that includes the modifier material.

FIG. 10B shows a step like that of FIG. 5C (formation of the rest of an anode electrode). In one embodiment, an anode electrode 1008 can be formed in the same manner as interface layer 1004, but not include modifier material(s), or have a different concentration of modifier material(s). Thus, in some embodiments an interface layer 1004 and anode electrode 1008 can be formed with same formation methods, but turning off, or otherwise altering a source of modifying materials while forming the anode electrode.

FIG. 10C shows a step like that of FIG. 5D (formation of the rest of an anode electrode).

Figures 0, 11A:
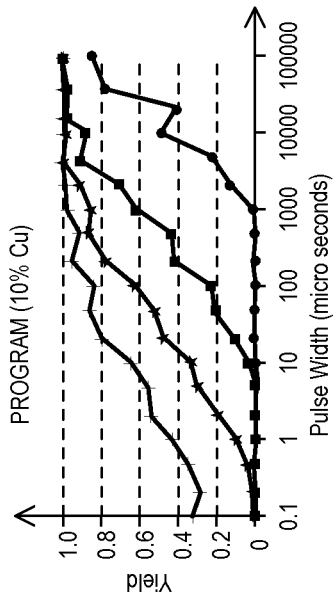
Figures 1, 11A:
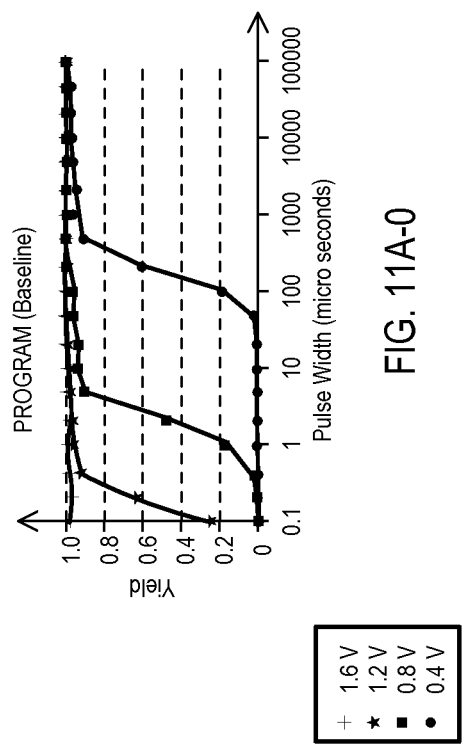
Figures 2, 11A:
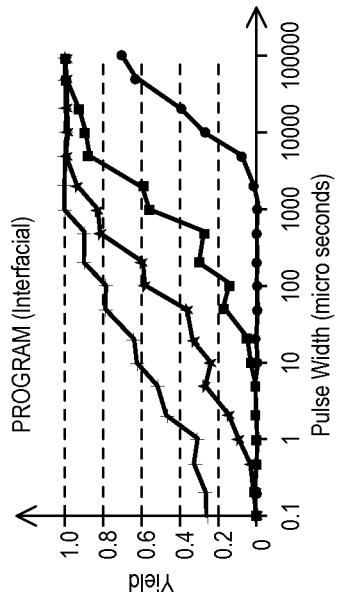
Figures 3, 11A:
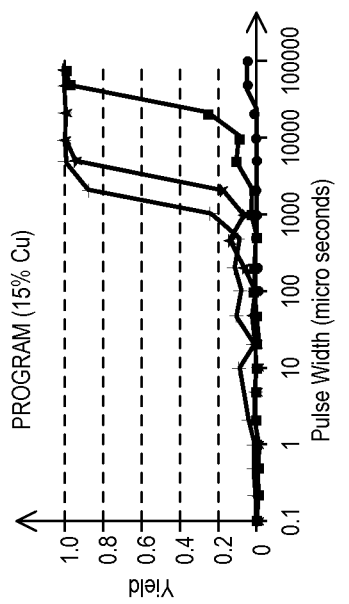

FIGS. 11A-0 to 11A-3 are graphs illustrating experimental results for memory elements according to particular embodiments. FIGS. 11A-0 to 11A-3 show CBRAM type elements having an anode formed from Ag, a memory material formed form GeSx, with Cu as a modifier material. FIG. 11A-0 shows results for conventional CBRAM elements, having GeSx as a memory layer, and no Cu modifiers. FIG. 11A-1 shows CBRAM elements having 10% (atomic percent) Cu in GeSx. FIG. 11A-2 shows CBRAM elements having 15% (atomic percent) Cu in GeSx. FIG. 11A-3 shows CBRAM elements that include a 20 angstrom Cu interfacial layer formed over the memory material and below an anode electrode of silver. The results of FIGS. 11A-0 to 11A-3 are for "fresh" elements.

FIGS. 11A-0 to 11A-3 show first time program yields versus pulse width (in microseconds (µs)), for various programming voltages (0.4V, 0.8V, 1.2V, 1.6V).

Figures 0, 11B:
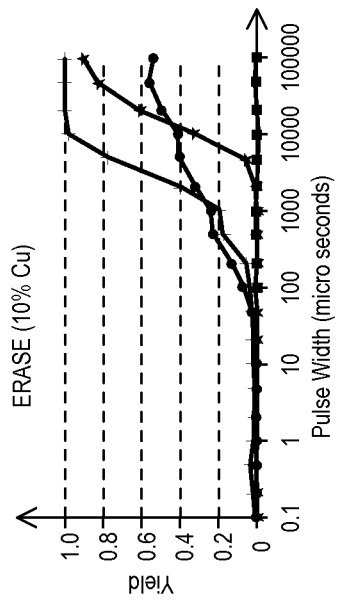
Figures 1, 11B:
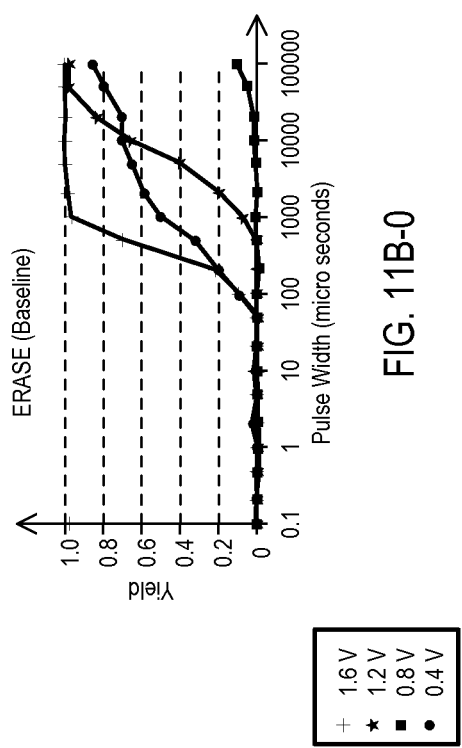
Figures 2, 11B:
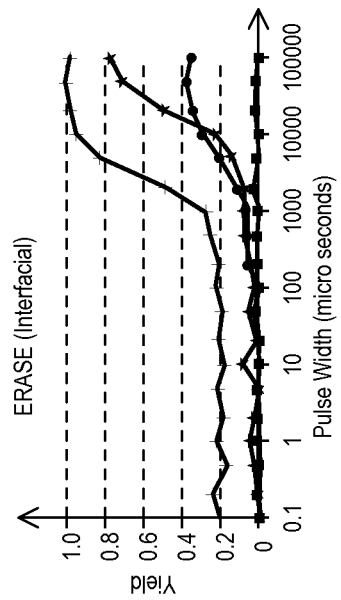
Figures 3, 11B:
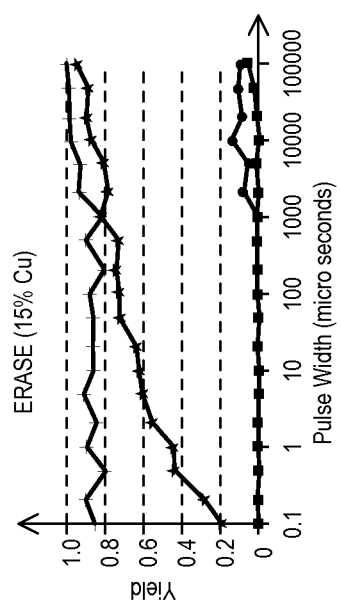

FIGS. 11B-0 to 11B-3 are graphs illustrating additional experimental results for memory elements according to particular embodiments. FIGS. 11B-0 to 11B-3 show results for elements like those of FIGS. 11A-0 to 11A-3, respectively, but for first time erase yields for the various erase voltages. The results of FIGS. 11B-0 to 11B-3 are also for fresh elements.

Figures 0, 11C:
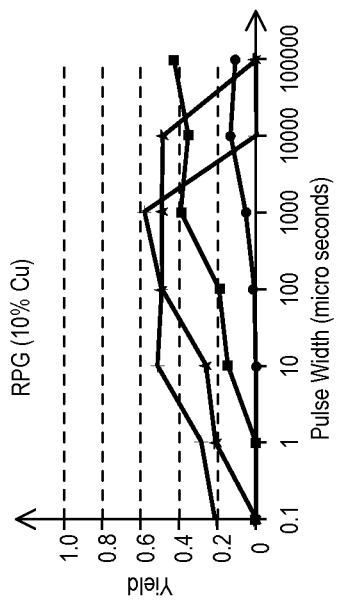
Figures 1, 11C:
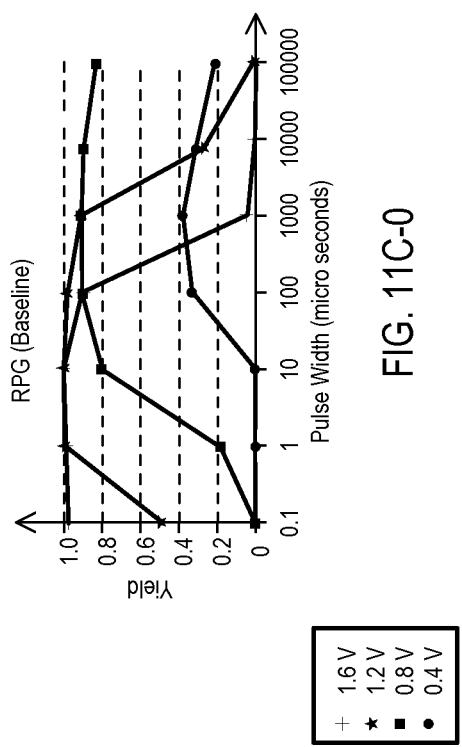
Figures 2, 11C:
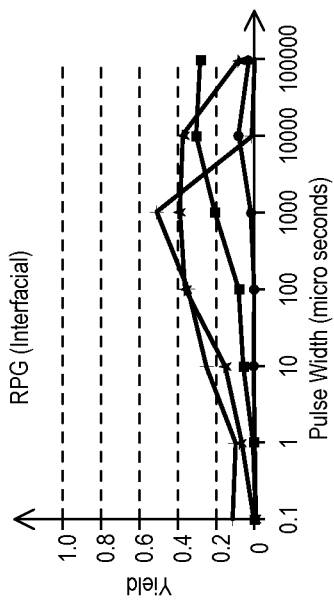
Figures 3, 11C:
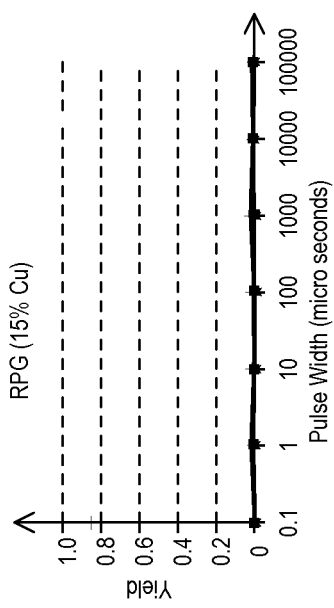

FIGS. 11C-0 to 11C-3 are graphs illustrating further experimental results for memory elements according to particular embodiments. FIGS. 11C-0 to 11C-3 show the occurrence of reverse programming for elements like those of FIGS. 11A-0 to 11A-3, respectively.

As shown in FIGS. 11A-0 to 11C-3, a smaller concentration of Cu (10%), and the Cu interface, can provide relatively fast program and erase speed, while reducing RPG. Higher concentrations of Cu (15%) can provide slower program/erase speeds, while essentially eliminating RPG in the samples.

FIG. 12 is a table showing program yields (PG Yield), erase yields (ER Yield) and a page program times (PAGE time) (in milliseconds) for memory elements according to embodiments having 10% Cu in a GeSx memory layer. Such yields and program times are for fresh elements.

As shown, page program times can be as short as 2 ms. This is comparable to conventional elements that have been subject to a forming step.

Figures 1, 13:
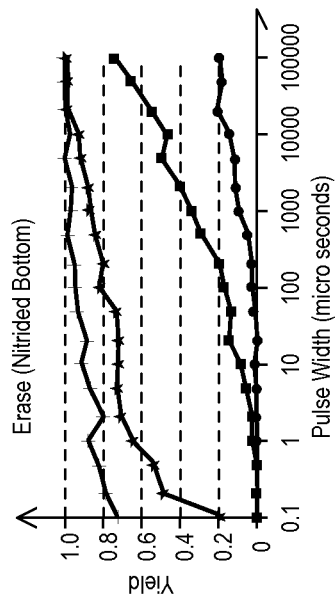
Figures 0, 13:
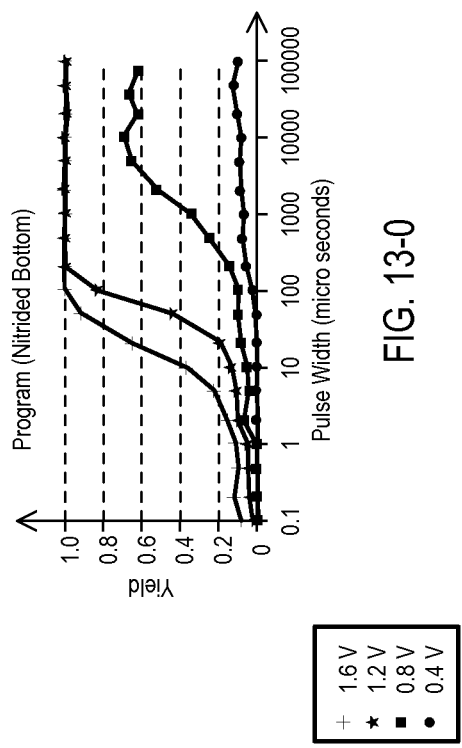
Figures 2, 13:
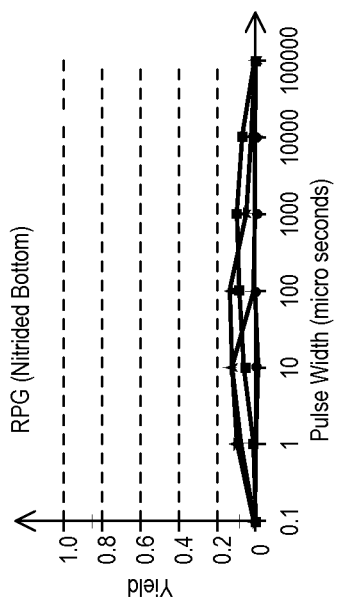

FIGS. 13-0 to 13-2 are graphs illustrating experimental results for memory elements according to additional embodiments. For FIGS. 13-0 to 13-2, CBRAM elements have a GeSx memory layer with a nitrided bottom layer (i.e., N as a non-metal modifier). FIG. 13-0 shows first time program yields versus pulse width for various programming voltages (0.4V, 0.8V, 1.2V, 1.6V). FIG. 13-1 shows first time erase yields for the various erase voltages. FIG. 13-2 shows the occurrence of reverse programming for such elements. The CBRAM elements are fresh elements.

As shown, the introduction of a nitride GeSx interface layer can provide program/erase times comparable to conventional elements subject to a forming step, with very little RPG.

FIG. 14 is a table showing experimental results for CBRAM elements like that of FIGS. 13-0 to 13-2 (i.e., CBRAM elements having a bottom nitride GeSx layer). Rows "NO PC" shows program/erase yields (PG Yield/ER Yield) and page program times (PG Page Time/ER Page Time) for elements that have not been subject to a forming step. Elements subject to a forming step are shown by rows "3 PC". As shown, yields are satisfactory with no forming step.

Further, page program times can be significantly faster than "fresh" conventional elements.

It is understood that the results shown in FIGS. 11 to 14 are but experimental results, and other embodiments may have different result, including better results, with variations in materials, dimensions, or fabrication process.

Embodiments of the invention can improve erase times for fresh elements by reducing and/or eliminating reverse programming. Embodiments may also enable memory elements with solid electrolyte memory layers to be fabricated for use without a forming step, or with a forming step that is shorter than conventional approaches.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory element, comprising: a first electrode; a second electrode; and a memory material disposed between the first electrode and the second electrode and comprising a solid electrolyte programmable between the different resistance states with at least one modifier element formed therein that is different from elements of the solid electrolyte; wherein the first electrode is an anode electrode that includes an anode element that is ion conductible in the solid electrolyte, the anode element being different than the modifier element, and the modifier element is not ion conductible in the solid electrolyte, and selected from the group of: a post transition metal, a non-metal, titanium, tantalum, zirconium and hafnium.

2. The memory element of claim 1, wherein:
the modifier element is selected from the group of: aluminum and tin.

3. The memory element of claim 1, wherein:
the solid electrolyte is selected from the group of: a chalcogen based solid electrolyte and a metal oxide.

4. The memory element of claim 1, wherein:
the modifier element is selected from the group of: nitrogen and oxygen.

5. A method of fabricating a memory element, comprising:
forming a first electrode;
forming a second electrode; and
forming a memory layer between the first and second electrodes,
the memory layer comprising a solid electrolyte layer programmable between different resistance states, a portion of the solid electrolyte layer having a modifier element formed therein to form an interface layer;
wherein
the first electrode is an anode electrode that includes an anode element that is ion conductible in the solid electrolyte, the anode element being different than the modifier element.

6. The method of claim 5, wherein:
forming the memory layer includes depositing a metal oxide as the solid electrolyte layer with the modifier element.

7. The method of claim 5, wherein:
forming the memory layer includes depositing a chalcogen based solid electrolyte with the modifier element.

8. The method of claim 5, wherein:
forming the memory layer includes sputtering at least the modifier element.

9. The method of claim 5, wherein:
the modifier element comprises a transition metal.

10. The method of claim 5, wherein:
the modifier element is selected from the group of: titanium, tantalum, zirconium and hafnium.

11. The method of claim 5, wherein:
the modifier element comprises a non-metal.

12. The method of claim 5, wherein:
forming the first electrode includes forming a layer comprising titanium.

13. A memory element, comprising:
a first electrode;
a second electrode; and
a memory material programmable between different resistance states, the memory material disposed between the first electrode and the second electrode and comprising a solid electrolyte with at least one modifier element formed in only a portion thereof, to create an interface layer; wherein
the first electrode is an anode electrode that includes an anode element that is ion conductible in the solid electrolyte, the anode element being different than the modifier element.

14. The memory element of claim 13, wherein:
the modifier element comprises a transition metal.

15. The memory element of claim 13, wherein:
the modifier element is selected from the group of titanium, tantalum, zirconium and hafnium.

16. The memory element of claim 13, wherein:
the modifier element is selected from the group of: a post-transition metal and a non-metal.

* * * * *